US011680321B2

(12) United States Patent
Joo et al.

(10) Patent No.: US 11,680,321 B2
(45) Date of Patent: Jun. 20, 2023

(54) APPARATUS AND METHOD FOR SEMICONDUCTOR FABRICATION

(71) Applicant: XIA TAI XIN SEMICONDUCTOR (QING DAO) LTD., Qingdao (CN)

(72) Inventors: Chan-Sul Joo, Singapore (SG); Jee-Hoon Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 17/679,662

(22) Filed: Feb. 24, 2022

(65) Prior Publication Data

US 2022/0178030 A1    Jun. 9, 2022

Related U.S. Application Data

(62) Division of application No. 16/708,737, filed on Dec. 10, 2019, now Pat. No. 11,286,565.

(60) Provisional application No. 62/780,368, filed on Dec. 17, 2018, provisional application No. 62/778,911, filed on Dec. 13, 2018.

(51) Int. Cl.
| | |
|---|---|
| *H01L 21/67* | (2006.01) |
| *C23C 16/455* | (2006.01) |
| *H01L 21/02* | (2006.01) |
| *H01J 37/32* | (2006.01) |
| *H01L 21/687* | (2006.01) |

(52) U.S. Cl.
CPC .. *C23C 16/45565* (2013.01); *H01J 37/32449* (2013.01); *H01L 21/02129* (2013.01); *H01L 21/02271* (2013.01); *H01L 21/67017* (2013.01); *H01L 21/687* (2013.01)

(58) Field of Classification Search
CPC ......... C23C 16/45565; C23C 16/45568; H01J 37/32449; H01J 37/3244; H01L 21/67017; H01L 21/687; H01L 21/02129; H01L 21/02271; H01L 21/67011; H01L 27/1085; H10B 12/03
USPC ...... 427/248.1; 118/715; 156/345.33, 345.34
See application file for complete search history.

(56) References Cited

U.S. PATENT DOCUMENTS

| | | | | |
|---|---|---|---|---|
| 4,780,169 A | * | 10/1988 | Stark | H01J 37/3244 156/345.34 |
| 5,415,753 A | * | 5/1995 | Hurwitt | C23C 14/0068 204/192.12 |

(Continued)

FOREIGN PATENT DOCUMENTS

JP            05175135 A   *   7/1993

*Primary Examiner* — Rudy Zervigon
(74) *Attorney, Agent, or Firm* — ScienBiziP, P.C.

(57) ABSTRACT

A method for fabricating a semiconductor device, including the steps of: providing a substrate having an etch stop layer formed thereon; forming a preliminary stacked structure on the etch stop layer, the preliminary stacked structure including a lower sacrifice layer contacting the etch stop layer, a support layer, and an upper sacrifice layer; forming a hole penetrating the preliminary stacked structure and the etch stop layer; forming a conductive pattern in the hole; removing the upper sacrifice layer and a portion of the support layer; removing the lower sacrifice layer; forming a first conductive layer covering the conductive pattern; and forming a dielectric layer covering the first conductive layer, a remaining portion of the support layer, and the etch stop layer.

10 Claims, 11 Drawing Sheets

(56) References Cited

U.S. PATENT DOCUMENTS

| | | | | |
|---|---|---|---|---|
| 5,439,524 | A * | 8/1995 | Cain | C23C 16/45565 118/715 |
| 5,500,256 | A * | 3/1996 | Watabe | C23C 16/45574 427/579 |
| 5,781,693 | A * | 7/1998 | Ballance | C23C 16/45565 118/724 |
| 5,792,269 | A * | 8/1998 | Deacon | C23C 16/45565 118/715 |
| 5,819,434 | A * | 10/1998 | Herchen | C23C 16/45565 34/232 |
| 6,024,799 | A * | 2/2000 | Chen | C23C 16/455 118/715 |
| 6,041,734 | A * | 3/2000 | Raoux | C23C 16/345 118/723 E |
| 6,050,506 | A * | 4/2000 | Guo | C23C 16/45565 239/558 |
| 6,051,286 | A * | 4/2000 | Zhao | C23C 16/4401 118/723 E |
| 6,059,885 | A * | 5/2000 | Ohashi | C30B 25/14 118/730 |
| 6,079,356 | A * | 6/2000 | Umotoy | C23C 16/455 118/723 E |
| 6,080,446 | A * | 6/2000 | Tobe | C23C 16/34 257/E21.168 |
| 6,098,568 | A * | 8/2000 | Raoux | C23C 16/5096 118/723 E |
| 6,106,625 | A * | 8/2000 | Koai | C23C 16/455 118/715 |
| 6,140,773 | A * | 10/2000 | Anders | H01J 37/32009 315/111.21 |
| 6,250,250 | B1 * | 6/2001 | Maishev | H01J 37/32009 118/723 ER |
| 6,381,021 | B1 * | 4/2002 | Somekh | G01N 21/55 356/445 |
| 6,388,381 | B2 * | 5/2002 | Anders | H05H 1/48 315/111.21 |
| 6,410,089 | B1 * | 6/2002 | Guo | C23C 16/45565 118/715 |
| 6,454,860 | B2 * | 9/2002 | Metzner | C23C 16/407 118/715 |
| 6,461,435 | B1 * | 10/2002 | Littau | C23C 16/45565 118/715 |
| 6,565,661 | B1 * | 5/2003 | Nguyen | C23C 16/45565 118/715 |
| 6,793,733 | B2 * | 9/2004 | Janakiraman | C23C 16/45565 118/715 |
| 6,800,139 | B1 * | 10/2004 | Shinriki | C23C 16/45574 118/715 |
| 6,942,753 | B2 * | 9/2005 | Choi | C23C 16/5096 156/345.34 |
| 7,004,107 | B1 * | 2/2006 | Raoux | C23C 16/45565 118/663 |
| 7,008,484 | B2 * | 3/2006 | Yim | C23C 16/45565 118/715 |
| 7,270,713 | B2 * | 9/2007 | Blonigan | C23C 16/455 118/715 |
| 7,429,410 | B2 * | 9/2008 | Keller | H01J 37/3244 427/578 |
| 7,581,511 | B2 * | 9/2009 | Mardian | C23C 16/045 118/723 ER |
| 7,819,081 | B2 * | 10/2010 | Kawasaki | C23C 16/45514 118/723 E |
| 7,829,145 | B2 * | 11/2010 | Balasubramanian | C23C 16/4405 427/255.28 |
| 8,074,599 | B2 * | 12/2011 | Choi | H01J 37/3244 118/723 R |
| 8,083,853 | B2 * | 12/2011 | Choi | H01J 37/32082 118/715 |
| 8,702,867 | B2 * | 4/2014 | Choi | C23C 16/45565 118/715 |
| 8,778,079 | B2 * | 7/2014 | Begarney | H01L 21/67017 118/715 |
| 9,224,581 | B2 * | 12/2015 | Mai | H01J 37/32449 |
| 9,484,190 | B2 * | 11/2016 | Glukhoy | H01J 37/3244 |
| 10,358,722 | B2 * | 7/2019 | Wiltse | C23C 16/45574 |
| 10,533,252 | B2 * | 1/2020 | Chiu | H01J 37/3244 |
| 10,851,457 | B2 * | 12/2020 | Shaikh | H01L 21/02216 |
| 2001/0006093 | A1 * | 7/2001 | Tabuchi | C23C 16/458 156/345.43 |
| 2003/0106643 | A1 * | 6/2003 | Tabuchi | C23C 16/24 156/345.35 |
| 2003/0207033 | A1 * | 11/2003 | Yim | C23C 16/45565 427/255.37 |
| 2003/0209323 | A1 * | 11/2003 | Yokogaki | C23C 16/45565 156/345.34 |
| 2004/0003777 | A1 * | 1/2004 | Carpenter | C23C 16/45544 118/715 |
| 2004/0035358 | A1 * | 2/2004 | Basceri | C23C 16/45565 118/715 |
| 2004/0058070 | A1 * | 3/2004 | Takeuchi | C23C 4/01 427/282 |
| 2004/0129211 | A1 * | 7/2004 | Blonigan | C23C 16/45565 118/715 |
| 2004/0238123 | A1 * | 12/2004 | Becknell | H01J 37/32844 156/345.33 |
| 2005/0126487 | A1 * | 6/2005 | Tabuchi | C23C 16/24 118/723 E |
| 2005/0223986 | A1 * | 10/2005 | Choi | B05B 1/005 118/715 |
| 2005/0251990 | A1 * | 11/2005 | Choi | H01J 37/3244 29/558 |
| 2005/0255257 | A1 * | 11/2005 | Choi | H01L 21/0217 427/585 |
| 2006/0005926 | A1 * | 1/2006 | Kang | H01J 37/32082 156/345.34 |
| 2006/0054280 | A1 * | 3/2006 | Jang | C23C 16/45565 156/345.34 |
| 2006/0060138 | A1 * | 3/2006 | Keller | H01J 37/3244 118/715 |
| 2006/0228490 | A1 * | 10/2006 | Wang | H01J 37/3244 427/457 |
| 2006/0228496 | A1 * | 10/2006 | Choi | H01J 37/3244 427/569 |
| 2006/0236934 | A1 * | 10/2006 | Choi | H01J 37/3244 118/723 R |
| 2007/0175396 | A1 * | 8/2007 | Kasai | H01J 37/3244 118/723 R |
| 2008/0020146 | A1 * | 1/2008 | Choi | C23C 16/455 427/446 |
| 2008/0141941 | A1 * | 6/2008 | Augustino | H01J 37/32541 118/723 R |
| 2008/0178807 | A1 * | 7/2008 | Wang | C23F 4/00 118/723 R |
| 2008/0302303 | A1 * | 12/2008 | Choi | H01J 37/32449 118/723 R |
| 2008/0305246 | A1 * | 12/2008 | Choi | H01L 31/182 427/74 |
| 2009/0288602 | A1 * | 11/2009 | Satake | H05H 1/46 118/723 E |
| 2010/0006031 | A1 * | 1/2010 | Choi | C23C 16/45565 118/723 R |
| 2012/0097330 | A1 * | 4/2012 | Iyengar | C23C 16/4557 156/345.34 |
| 2012/0222815 | A1 * | 9/2012 | Sabri | C23C 16/45565 156/345.34 |
| 2012/0267048 | A1 * | 10/2012 | Moyama | H01J 37/32192 156/345.33 |
| 2012/0304933 | A1 * | 12/2012 | Mai | C23C 16/5096 118/723 I |
| 2015/0214009 | A1 | 7/2015 | Glukhoy | |
| 2015/0247237 | A1 * | 9/2015 | Ha | C23C 16/4585 118/715 |
| 2015/0332893 | A1 * | 11/2015 | Tabuchi | H01J 37/32715 156/345.33 |
| 2015/0345020 | A1 * | 12/2015 | Tucker | H01J 37/32513 118/723 R |

(56) References Cited

U.S. PATENT DOCUMENTS

2017/0167024 A1* 6/2017 Wiltse ............... C23C 16/45565
2019/0043696 A1* 2/2019 Jiang ................. H01J 37/32449
2019/0218665 A1* 7/2019 Chang ................ H01J 37/3244
2021/0054506 A1* 2/2021 Chen .................. H01J 37/3244

* cited by examiner

APPARATUS AND METHOD FOR SEMICONDUCTOR FABRICATION

FIELD

The present disclosure generally relates to an apparatus and a method for use in semiconductor fabrication. More specifically, the present disclosure relates to processing a substrate for fabricating a semiconductor device.

BACKGROUND

Due to a rapid and widespread usage of information devices, the need for memory semiconductor devices is expanding. As device scale reduces, memory semiconductor devices require high storage capacitance and fast operation speed. Process technology has been focusing on improving the response speed, reliability and integration of memory devices. For example, dynamic random access memory (DRAM) devices generally include one access transistor and one storage capacitor. Boron phosphorous silicate glass (BPSG) and/or phosphorous silicate glass (PSG) films have been used as structural films to form the capacitor. Normally, deposition of the BPSG/PSG film on a substrate is performed by low-pressure chemical vapor deposition (LPCVD), in which chemical reactants are dispensed through a showerhead onto the substrate.

SUMMARY

In view of above, the present disclosure is directed to processing a substrate for fabricating a semiconductor device.

An implementation of the present application is directed to an apparatus for processing a substrate. The apparatus comprises a processing chamber and a showerhead. The showerhead is in the processing chamber and has a plurality of first holes with a first size in a first zone of the showerhead, a plurality of second holes with a second hole size in a second zone of the showerhead, and a plurality of third holes with a third hole size in a third zone of the showerhead. The first hole size is different from the second hole size. The first zone is surrounded by the second zone. An area of the first zone is larger than an area of the second zone.

BRIEF DESCRIPTION OF THE DRAWINGS

The drawings are directed to a manner in which the recited features of the present disclosure can be understood in detail, and to a more particular description of the disclosure briefly summarized above which may be had by reference to implementation, some of which are illustrated in the drawings. It is to be noted, however, that the drawings illustrate only typical implementation of this disclosure and are therefore not to be considered limiting of its scope, for the disclosure may relate to other equally effective implementation.

Figure 1:
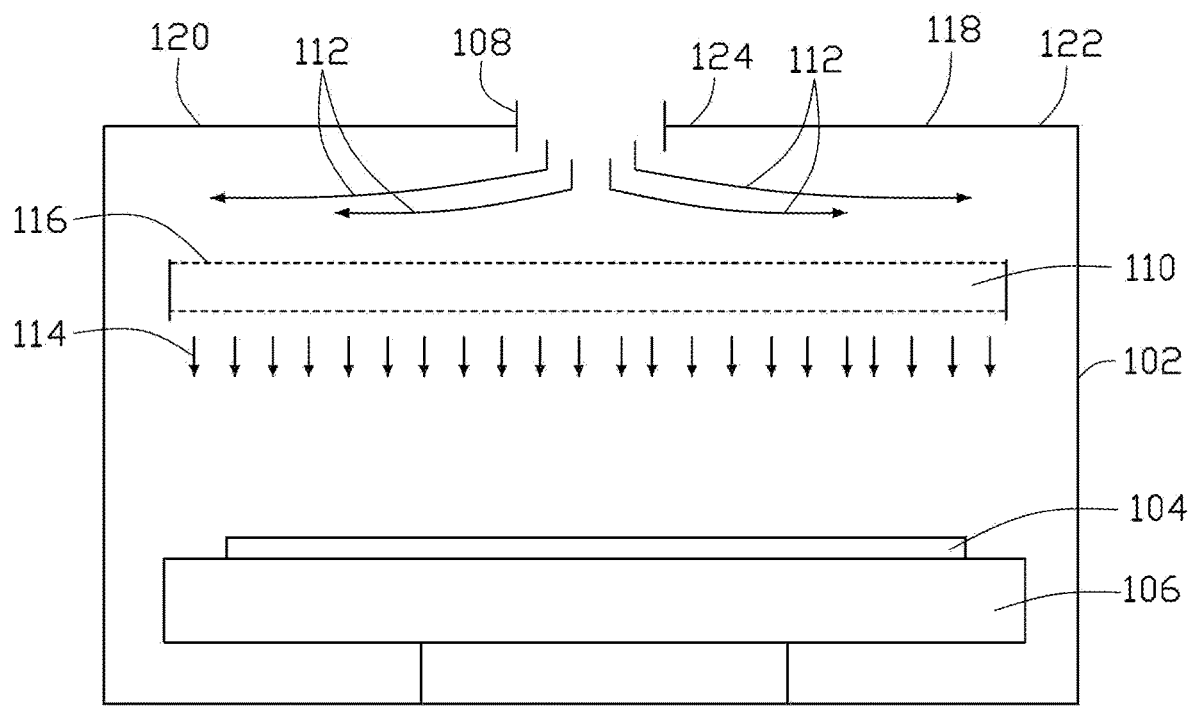
FIG. 1 illustrates an apparatus for processing a substrate according to an example implementation of the present disclosure.

It is to be noted, however, that the appended drawings illustrate only example implementations of this disclosure and are therefore not to be considered limiting of its scope, for the disclosure may relate to other equally effective implementation.

It should be noted that these figures are intended to illustrate the general characteristics of methods, structure and/or materials utilized in certain example implementation and to supplement the written description provided below. These drawings are not, however, to scale and may not precisely reflect the precise structural or performance characteristics of any given implementation, and should not be interpreted as defining or limiting the range of values or properties encompassed by example implementation. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which example implementation of the disclosure are shown. This disclosure may, however, be implemented in many different forms and should not be construed as limited to the example implementation set forth herein. Rather, these example implementations are provided so that this disclosure will be thorough and complete, and will fully convey the scope of the disclosure to those skilled in the art. Like reference numerals refer to like elements throughout.

The terminology used herein is for the purpose of describing particular example implementation only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, actions, operations, elements, and/or components, but do not preclude the presence or addition of one or more other features, regions, integers, actions, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example implementations of the present disclosure are directed to an apparatus for processing a wafer/substrate. The apparatus may be a deposition apparatus, such as a chemical vapor deposition (CVD) apparatus, an etching apparatus, or a cleaning apparatus. The apparatus includes a showerhead, e.g., showerheads 200, 300, 500, 600, 800, and 900 in FIGS. 2, 3, 5, 6, 8, and 9, respectively. The showerhead has two or more zones, each of which is formed with a plurality of holes or channels through which gas/dopants may flow. The sizes of the holes in the showerhead of the present disclosure are varied from one zone to another. The construction as such permits even distribution of gas flowing from the showerhead of the present disclosure, allowing formation of a film having a substantially uniform thickness or concentration of dopants on a substrate.

The description will be made as to the example implementations in conjunction with the accompanying drawings in FIGS. 1 to 11. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates an apparatus 100 for processing a substrate 104 according to an example implementation of the present disclosure. As illustrated in FIG. 1, the apparatus 100 includes a processing chamber 102, a substrate support 106 (e.g., a chuck) positioned in a bottom or a substrate processing zone of the processing chamber 102 and configured to support a substrate 104 thereon, a gas inlet 108 coupled to a top surface 118 of the processing chamber 102 for permitting gas (such as phosphine, phosphorous) to flow therethrough, and a showerhead 110 placed under the gas inlet 108. In certain implementations, a blocker plate (not shown) is mounted between the showerhead 110 and the top surface 118 of the processing chamber 102.

The top surface 118 of the processing chamber 102 has opposite first and second end portions 120, 122 and a middle portion 124 between the first and second end portions 120, 122. In an example implementation of the present disclosure, the gas inlet or gas line 108 is mounted at the middle portion 124 of the top surface 118 of the processing chamber 102. A first processing gas 112 may flow from a gas source (not shown), through the gas inlet 108, and to the showerhead 110 such that the first processing gas 112 is unevenly distributed over the showerhead 110. That is, the amount of the first processing gas 112 flowing to the showerhead 110 is larger at the center of the showerhead 110 than the edge of the showerhead 110.

The showerhead 110 includes a plurality of through holes 116 that allow the first processing gas 112 to flow therethrough. A second processing gas 114 flows from the showerhead 110 and is distributed over the substrate 104 when the first processing gas 112 flows through the showerhead 110. As will be described below, the showerhead 110 of the present disclosure permits even distribution of the second processing gas 114 (such as phosphine, phosphorous) over the substrate 104, allowing a film (e.g., borophosphosilicate (BSPG) or phosphosilicate glass (PSG)) with a substantially uniform thickness to be formed on the substrate 104.

In the conventional showerheads, the diameters of all of holes in the showerhead are identical to each other. This causes a larger amount of the second processing gas to flow from the center of the showerhead than the edge of the showerhead. This is because the first processing gas, which passes through the gas inlet mounted at the middle portion of the top surface of the processing chamber, has to travel farther to reach the edge of the showerhead than the center of the showerhead. In other words, the second processing gas 114 flowing from the conventional showerhead is unevenly distributed over the substrate. Consequently, the thickness of the film or the concentration of the dopant of the film deposited on the substrate is not uniform. That is, the thickness of the deposited film or the concentration of the dopant of the deposited film may peak at the substrate center and gradually decrease toward the substrate edge.

Figure 10:
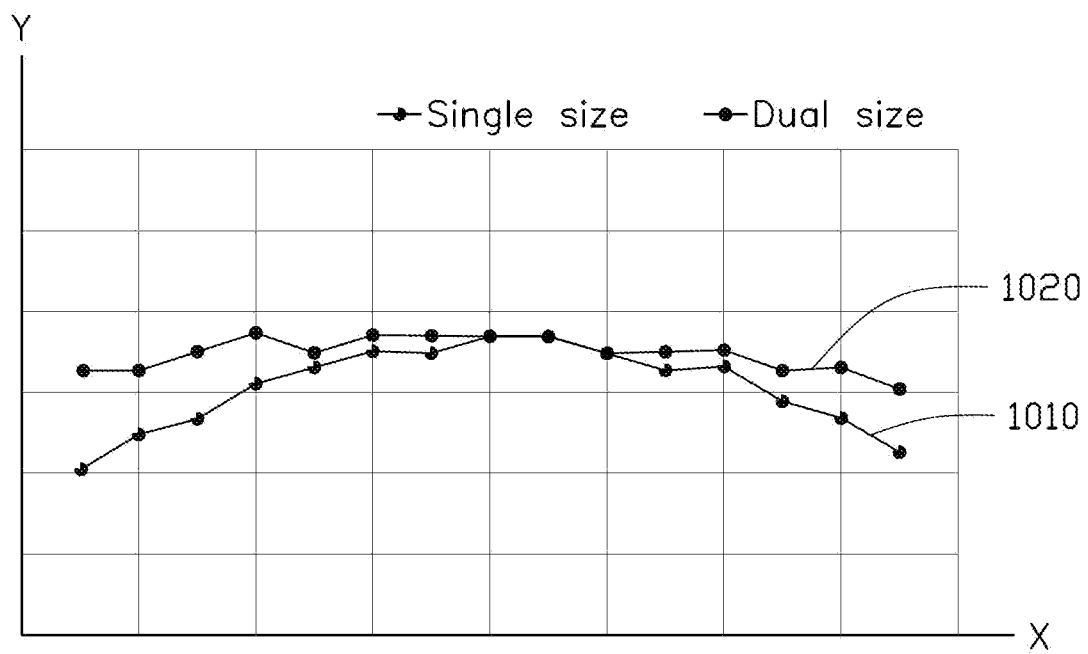
FIG. 10 is a graph illustrating compared concentrations of dopants of films according to an example implementation of the present disclosure.

FIG. 10 is a graph illustrating compared concentrations of dopants of films 1010 and 1020 according to an example implementation of the present disclosure. As illustrated in FIG. 10, based on experimental results, when a first film 1010 is formed over a first substrate using the apparatus that includes the conventional showerhead and a second film 1020 is formed over a second substrate using the apparatus of the present disclosure, the graph of the concentration of the dopant of the second film 1020 is flatter than the graph of the concentration of the dopant of the first film 1010. That is, unlike the concentration of the dopant of the film 1010, which peaks at the substrate center and gradually decreases toward the substrate edge, the concentration of the dopant of the film 1020 at the substrate center is substantially the same as the concentration of the dopant of the film 1020 at the substrate edge. Indeed, the processing gas that flow from the showerhead of the present disclosure is evenly distributed over the substrate.

In various implementations of the present disclosure, the showerhead 110 of the present disclosure is divided into different zones. The sizes (e.g., widths or diameters) of the holes or channels 116 in the showerhead 110 are varied from one zone to another. For example, the showerhead 110 may be divided into a first zone at a center of the showerhead 110 and a second zone surrounding the first zone. The holes 116 in the first zone of the showerhead 110 may have a smaller hole size than the holes 116 in the second zone of the showerhead 110, allowing an even distribution of the second processing gas 114 flowing from the showerhead 110 over the substrate 104.

Figure 2:
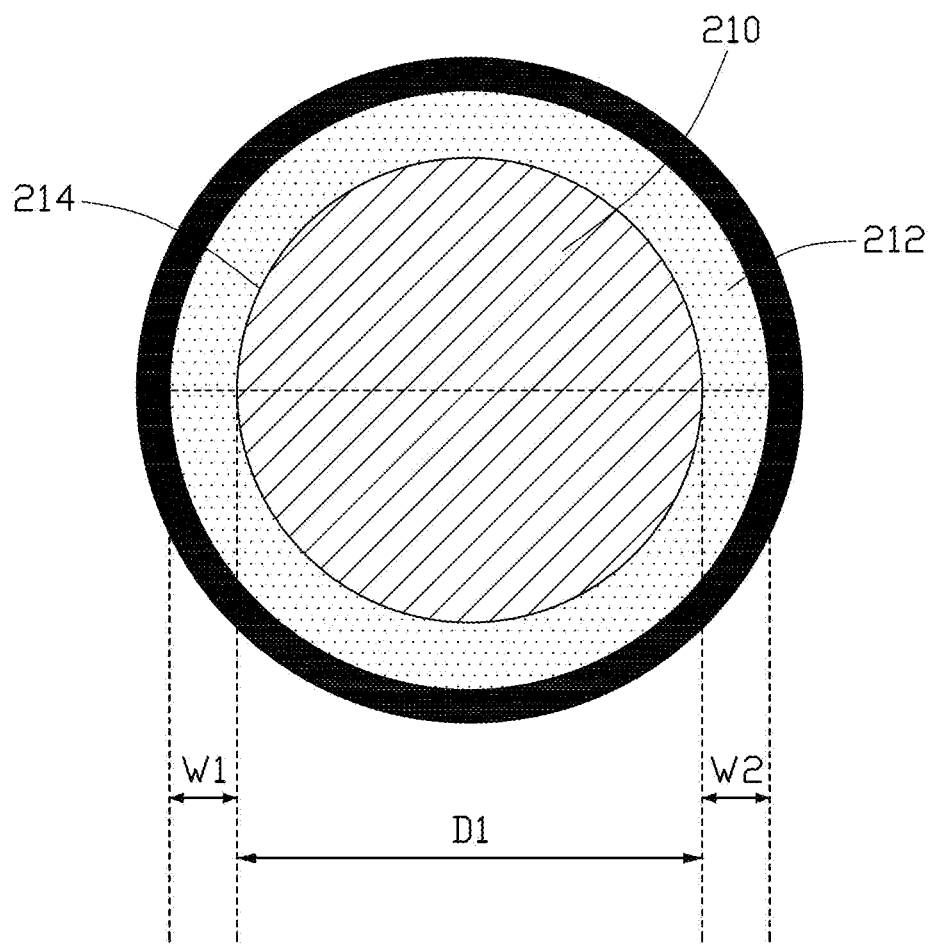
FIG. 2 illustrates a top view of a showerhead according to an example implementation of the present disclosure.

FIG. 2 illustrates a top view of a showerhead 200 of the apparatus 100 according to an example implementation of the present disclosure. As illustrated in FIG. 2, the holes in the showerhead 200 are grouped into a zone 210 at a center of the showerhead 200 and a zone 212 surrounding the zone 210. The zones 210, 212 define an interface 214 therebetween. In various implementations, the interface 214 is circular. In other implementations, the interface 214 is polygonal (e.g., triangular or rectangular).

In this example implementation, the sizes (e.g., widths or diameters) of the holes in the zone 210 are identical to each other. The sizes (e.g., widths or diameters) of the holes in the zone 212 are identical to each other. The holes in the zone 212 have a larger hole size than the holes in the zone 210. For example, the sizes of the holes in the zone 210 is from about 0.68 mm to about 0.72 mm. The term "about" means ±0.02 mm.

In various implementations, the widths of the zone 210 is about 210 mm to 250 mm. The zone 210 is generally circular shape and has a diameter (D1) from about 210 mm to about 250 mm. The term "about" means ±20 mm. The size of the holes in the zone 212 is from about 0.72 mm to about 0.74 mm. The term "about" means ±0.02 mm. In other implementations, the zone 210 has a diameter (D1) from about 220 mm to about 300 mm. The term "about" means ±10 mm.

The zone 212 is generally ring shape and has widths (W1, W2) at opposite sides thereof. In this example implementation, the area of zone 210 is greater than the area of the zone 212. In various implementations, the first width (W1) of the zone 212 is substantially equal to the second width (W2) of the zone 212. In other implementations, the first width (W1) of the zone 212 is different from, i.e., larger or smaller than, the second width (W2) of the zone 212. In various implementations, the open area of the zone 210 is from about 800 mm2 to about 1000 mm2. The open area of the zone 212 is from about 200 mm2 to about 300 mm2. The term "open area" means how much of the area is occupied by the holes. In various implementations, each of the holes has cross-sections (e.g., a circular cross-section). The summation of the areas of the cross-sections of the holes in the zone 210 is from about 800 mm2 to about 1000 mm2. The summation of the areas of the cross-sections of the holes in the zone 212 is from about 200 mm2 to about 300 mm2.

Figure 3:
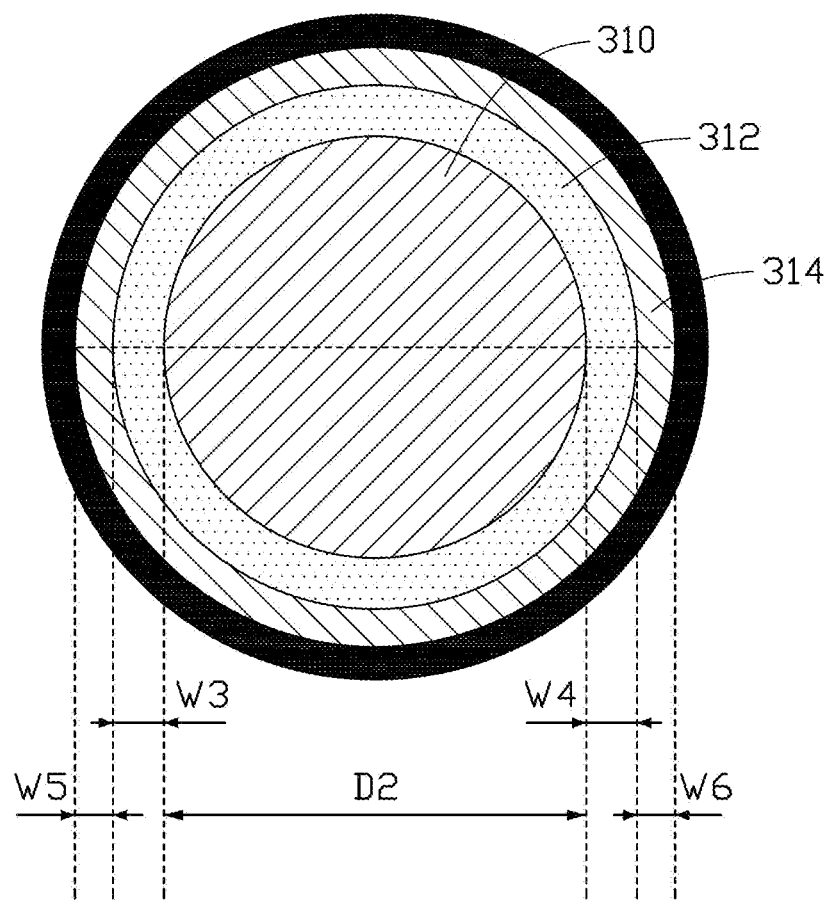
FIG. 3 illustrates a top view of a showerhead according to an example implementation of the present disclosure.

FIG. 3 illustrates a top view of a showerhead 300 of the apparatus 100 according to an example implementation of the present disclosure. As illustrated in FIG. 3, the showerhead 300 differs from the showerhead 200 in that the showerhead 300 is divided into three zones 310, 312, 314, each of which is formed with a plurality of holes. In this example implementation, the sizes (e.g., widths or diameters) of the holes in the zone 310 are identical to each other. The sizes (e.g., widths or diameters) of the holes in the zone 312 are identical to each other. The sizes (e.g., widths or diameters) of the holes in the zone 314 are identical to each other. The size of the holes in the zone 314 is larger than the size of the holes in the zone 312. The size of the holes in the zone 312 is larger than the size of the holes in the zone 310. For example, the diameter of the hole size in the zone 310 is from about 0.68 mm to about 0.72 mm. The term "about" means ±0.02 mm.

The zone 310 is generally circular shape and has a diameter (D2) from about 90 mm to about 100 mm. The term "about" means ±10 mm. In various implementations, the open area of the zone 310 is from about 700 mm2 to about 900 mm2. The term "open area" means how much of the area is occupied by the holes. In various implementations, each of the holes has cross-sections (e.g., a circular cross-section). The summation of the areas of the cross-sections of the holes in the zone 310 is from about 700 mm2 to about 900 mm2.

The hole size in the zone 312 is from about 0.72 mm to about 0.74 mm. The term "about" means ±0.02 mm. The zone 312 is generally ring shape and has widths (W3, W4) at opposite sides thereof. In various implementations, the width (W3) of the zone 312 is substantially equal to the width (W4) of the zone 312. In other implementations, the width (W3) of the zone 312 is different from, i.e., greater or smaller than, the width (W4) of the zone 312. In this example implementation, the area of the zone 312 is smaller than the area of the zone 310. In various implementations, the open area of the zone 312 is from about 100 mm2 to about 200 mm2. The term "open area" means how much of the area is occupied by the holes. In various implementations, each of the holes has cross-sections (e.g., a circular cross-section). The summation of the areas of the cross-sections of the holes in the zone 312 is from about 100 mm2 to about 200 mm2.

The hole size in the zone 314 is from about 0.74 mm to about 0.76 mm. The term "about" means ±0.02 mm. The zone 314 is generally ring shape and has widths (W5, W6) at opposite sides thereof. In various implementations, the width (W5) of the zone 314 is substantially equal to the width (W6) of the zone 314. In other implementations, the width (W5) of the zone 314 is different from, i.e., greater or smaller than, the width (W6) of the zone 314. In various implementations, the area of the zone 312 is smaller than the area of the zone 314. In various implementations, the area of the zone 312 is substantially equal to the area of the zone 314. In various implementations, the open area of the zone 314 is from about 200 mm2 to about 300 mm2. The term "open area" means how much of the area is occupied by the holes. In various implementations, each of the holes has cross-sections (e.g., a circular cross-section). The summation of the areas of the cross-sections of the holes in the zone 314 is from about 200 mm2 to about 300 mm2.

In various implementations, one of the widths (W5, W6) of the zone 314 is smaller or greater than one of the widths (W3, W4) of the zone 312.

Figure 4:
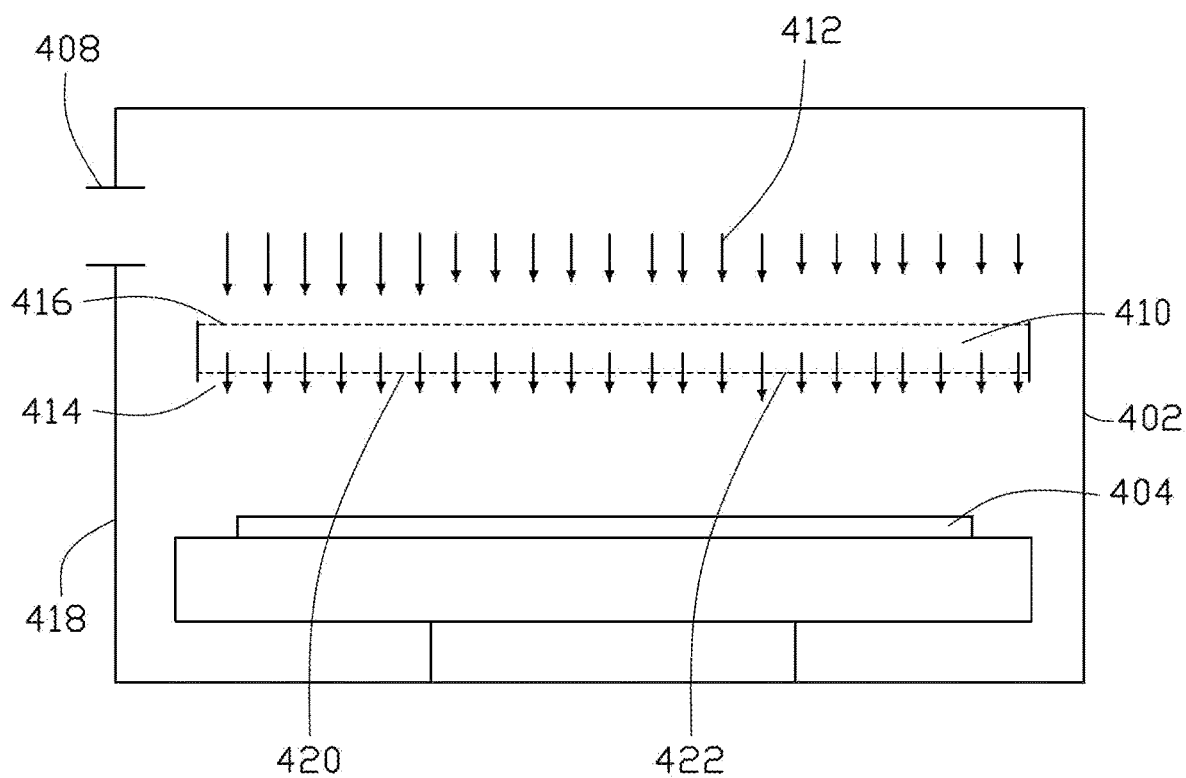
FIG. 4 illustrates an apparatus for processing a substrate according to an example implementation of the present disclosure.

FIG. 4 illustrates an apparatus 400 for processing a substrate 404 according to an example implementation of the present disclosure. As illustrated in FIG. 4, the apparatus 400 differs from the apparatus 100 in that the gas inlet 408 of the apparatus 400 is mounted at a sidewall 418 of the processing chamber 402. A first processing gas 412 may flow from a gas source (not shown), through the gas inlet 408, and to the showerhead 410 such that the first processing gas 412 is unevenly distributed over the showerhead 410. That is, the amount of first processing gas 412 flowing to the showerhead 410 is larger at a first side 420 of the showerhead 410 than a second side 422 of the showerhead 410 opposite the first side 420 of the showerhead 410.

The showerhead 410 includes a plurality of through holes 416 that allow the first processing gas 412 to flow therethrough. A second processing gas 414 flows from the showerhead 410 and is distributed over the substrate 404 when the first processing gas 412 flows through the showerhead 410. As will be described below, the showerhead 410 of the present disclosure permits even distribution of the second processing gas 414 (such as phosphine, phosphorous) over the substrate 404, allowing a film (e.g., BSPG or PSG) with a substantially uniform thickness to be formed on the substrate 404.

In various implementations of the present disclosure, the showerhead 410 of the apparatus 400 is divided into different zones, and the sizes (e.g., widths or diameters) of the holes or channels 416 in the showerhead 410 are varied from one zone to another. For example, the showerhead 410 may be divided into a first zone at the first side 420 of the showerhead 410 and a second zone at the second side 422 of the showerhead 410. The holes 416 in the first zone of the showerhead 410 may have a smaller hole size than the holes 416 in the second zone of the showerhead 410, allowing an even distribution of the second processing gas 414 flowing from the showerhead 410 over the substrate 404.

Figure 5:
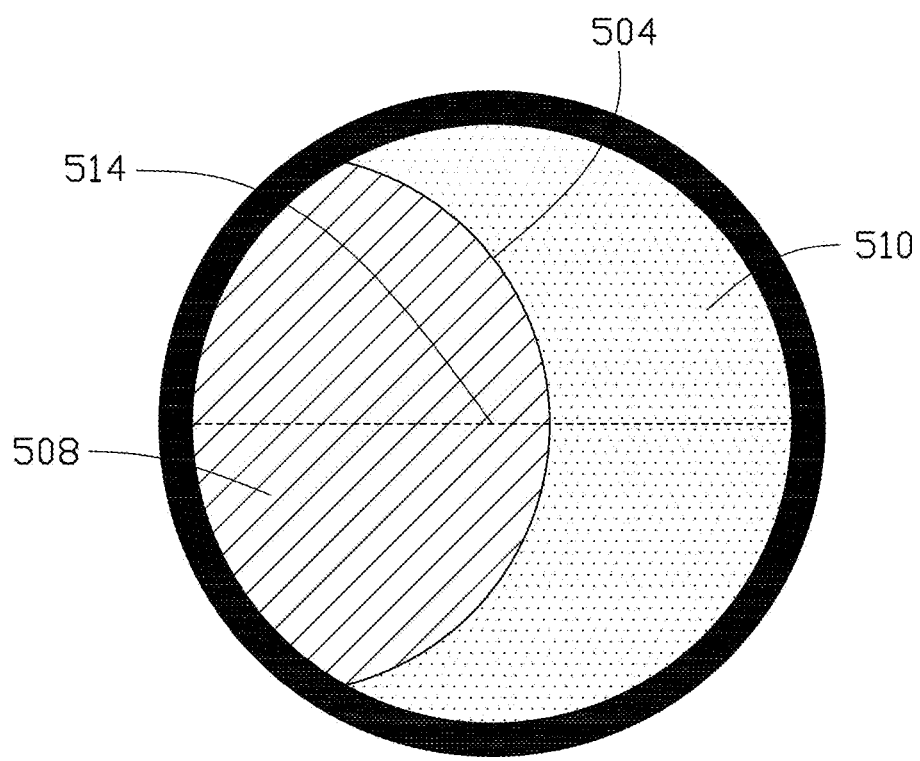
FIG. 5 illustrates a top view of a showerhead according to an example implementation of the present disclosure.

FIG. 5 illustrates a top view of a showerhead 500 of the apparatus 400 according to an example implementation of the present disclosure. As illustrated in FIG. 5, the holes in the showerhead 500 are grouped into a zone 508 at a first side of the showerhead 500 and a zone 510 at a second side of the showerhead 500 opposite the first side of the showerhead 500. The zones 508 and 510 define an interface 504 therebetween. In various implementations, the interface 504 is arcuate. In other implementations, the interface 504 is straight.

In this example implementation, the sizes (e.g., widths or diameters) of the holes in the zone 508 are identical to each other. The sizes (e.g., widths or diameters) of the holes in the zone 510 are identical to each other. The holes in the zone 510 have a larger hole size than the holes in the zone 508. For example, the size of the holes in the zone 508 is from about 0.68 mm to about 0.72 mm. The term "about" means ±0.02 mm.

In this example implementation, the center 514 of the showerhead 500 is inside the zone 508. In an alternative implementation, the center 514 of the showerhead 500 is inside the zone 510. The size of the holes in the zone 510 is from about 0.72 mm to about 0.74 mm. The term "about" means ±0.02. In this example implementation, the area of the zone 508 is larger than the area of the zone 510. In various implementations, the open area of the zone 508 is from about 800 mm2 to about 1000 mm2. The open area of the zone 510 is from about 200 mm2 to about 300 mm2. The term "open area" means how much of the area is occupied by the holes. In various implementations, each of the holes has cross-sections (e.g., a circular cross-section). The summation of the areas of the cross-sections of the holes in the zone 508 is from about 800 mm2 to about 1000 mm2. The summation of the areas of the cross-sections of the holes in the zone 510 is from about 200 mm2 to about 300 mm2.

Figure 6:
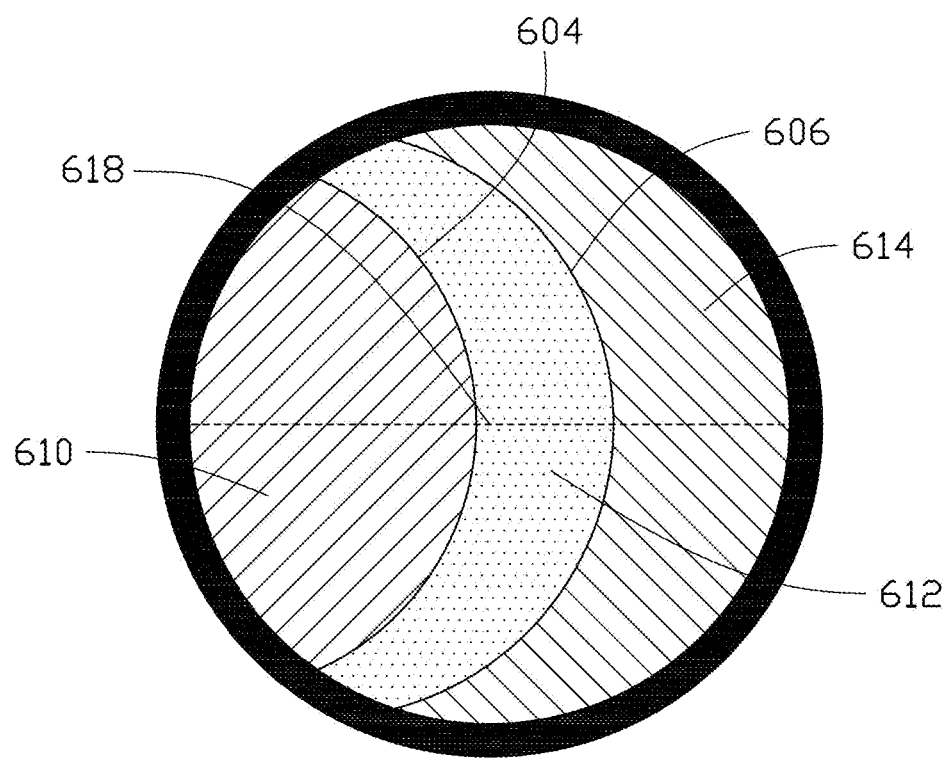
FIG. 6 illustrates a top view of a showerhead according to an example implementation of the present disclosure.

FIG. 6 illustrates a top view of a showerhead 600 of the apparatus 400 according to an example implementation of the present disclosure. As illustrated in FIG. 6, the showerhead 600 differs from the showerhead 500 in that the showerhead 600 is divided into three zones 610, 612, 614, each of which is formed with a plurality of holes. The zone 610 is at a first side of the showerhead 600. The zone 614 is at a second side of the showerhead 600 opposite the first side of the showerhead 600. The zone 612 is between the zones 610, 614. The zones 610, 612 define a first interface 604 therebetween. In various implementations, the first interface 604 is arcuate. In other implementations, the first interface 604 is straight. The zones 612, 614 define a second interface 606 therebetween. In various implementations, the second interface 606 is arcuate. In other implementations, the second interface 606 is straight. In this example implementation, the second interface 606 has a longer length than the first interface 604. In various implementations, the second interface 606 has substantially the same length as the first interface 604. In other implementations, the second interface 606 has a shorter length than the first interface 604.

In this example implementation, the sizes (e.g., widths or diameters) of the holes in the zone 610 are identical to each other. The sizes (e.g., widths or diameters) of the holes in the zone 612 are identical to each other. The sizes (e.g., widths or diameters) of the holes in the zone 614 are identical to each other.

In this example implementation, the center 618 of the showerhead 600 is inside the zone 612. In various implementations, the center 618 of the showerhead 600 is inside the zone 610. In other implementations, the center 618 of the showerhead 600 is inside the zone 614. The size of the holes in the zone 614 is larger than the size of the holes in the zone 612. The size of the holes in the zone 612 is larger than the size of the holes in the zone 610. For example, the size of the holes in the zone 610 is from about 0.68 mm to about 0.72 mm. The term "about" means ±0.02 mm. The size of the holes in the zone 612 is from about 0.72 mm to about 0.74 mm. The term "about" means ±0.02 mm. The size of the holes in the zone 614 is from about 0.74 mm to about 0.76 mm. The term "about" means ±0.02 mm.

In this example implementation, the area of the zone 610 is larger than the area of the zones 612, 614. The area of the zone 614 is larger than the area of the zone 612. In other implementations, the area of the zone 614 is substantially equal to the area of the zone 612. In various implementations, the open area of the zone 610 is from about 700 mm2 to about 900 mm2. The open area of the zone 612 is from about 100 mm2 to about 200 mm2. The open area of the zone 614 is from about 200 mm2 to about 300 mm2. The term "open area" means how much of the area is occupied by the holes. In various implementations, each of the holes has cross-sections (e.g., a circular cross-section). The summation of the areas of the cross-sections of the holes in the zone 610 is from about 700 mm2 to about 900 mm2. The summation of the areas of the cross-sections of the holes in the zone 612 is from about 100 mm2 to about 200 mm2. The summation of the areas of the cross-sections of the holes in the zone 614 is from about 200 mm2 to about 300 mm2.

Figure 7:
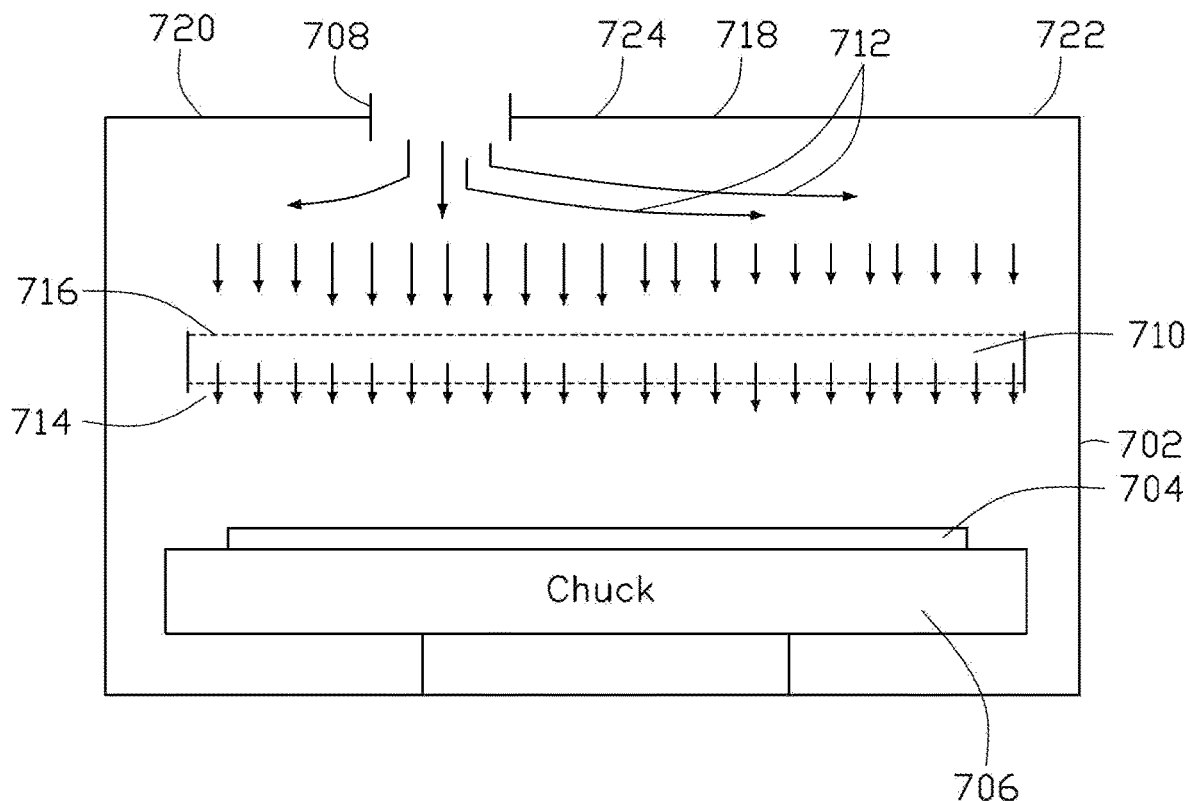
FIG. 7 illustrates an apparatus for processing on a substrate according to an example implementation of the present disclosure.

FIG. 7 illustrates an apparatus 700 for processing a substrate 704 according to an example implementation of the present disclosure. As illustrated in FIG. 7, the apparatus 700 includes a processing chamber 702, a substrate support 706 (e.g., a chuck) positioned in a bottom or a substrate processing zone of the processing chamber 702 and configured to support a substrate 704 thereon, a gas inlet 708 coupled to a top surface 718 of the processing chamber 702 for permitting gas (such as phosphine, phosphorous) to flow therethrough, and a showerhead 710 placed under the gas inlet 708. The top surface 718 of the processing chamber 702 has opposite first and second end portions 720, 722 and a middle portion 724 between the first and second end portions 720, 722. The apparatus 700 differs from the apparatus 100 and the apparatus 400 in that the gas inlet 708 of the apparatus 700 is mounted between the middle portion 724 and the end portion 720 of the top surface 718 of the processing chamber 702. A first processing gas 712 may flow from a gas source (not shown), through the gas inlet 708, and to the showerhead 710 such that the first processing gas 712 is unevenly distributed over the showerhead 710. That is, the amount of the first processing gas 712 flowing to the showerhead 710 is larger at a location between a center and an edge of the showerhead 710 than the center of the showerhead 710.

The showerhead 710 includes a plurality of through holes 716 that allows a first processing gas 712 to flow therethrough. A second processing gas 714 flows from the showerhead 710 and is distributed over a substrate 704 when the first processing gas 712 flows through the showerhead 710. As will be described below, the showerhead 710 of the present disclosure permits even distribution of the second processing gas 714 (such as phosphine, phosphorous) over the substrate 704, allowing a film (e.g., BSPG or PSG) with a substantially uniform thickness to be formed on the substrate 704.

In various implementations of the present disclosure, the showerhead 710 of the apparatus 700 is divided into different zones and the sizes (e.g., widths or diameters) of the holes or channels 716 in the showerhead 710 vary from one zone to another. For example, the showerhead 710 may be divided into a first zone at a first side of the showerhead 710 and a second zone at a second side of the showerhead 710 opposite the first side of the showerhead. The holes 716 in the first zone of the showerhead 710 may have a smaller hole size than the holes in the second zone of the showerhead 710, allowing an even distribution of the second processing gas 714 flowing from the showerhead 710 over the substrate 704.

Figure 8:
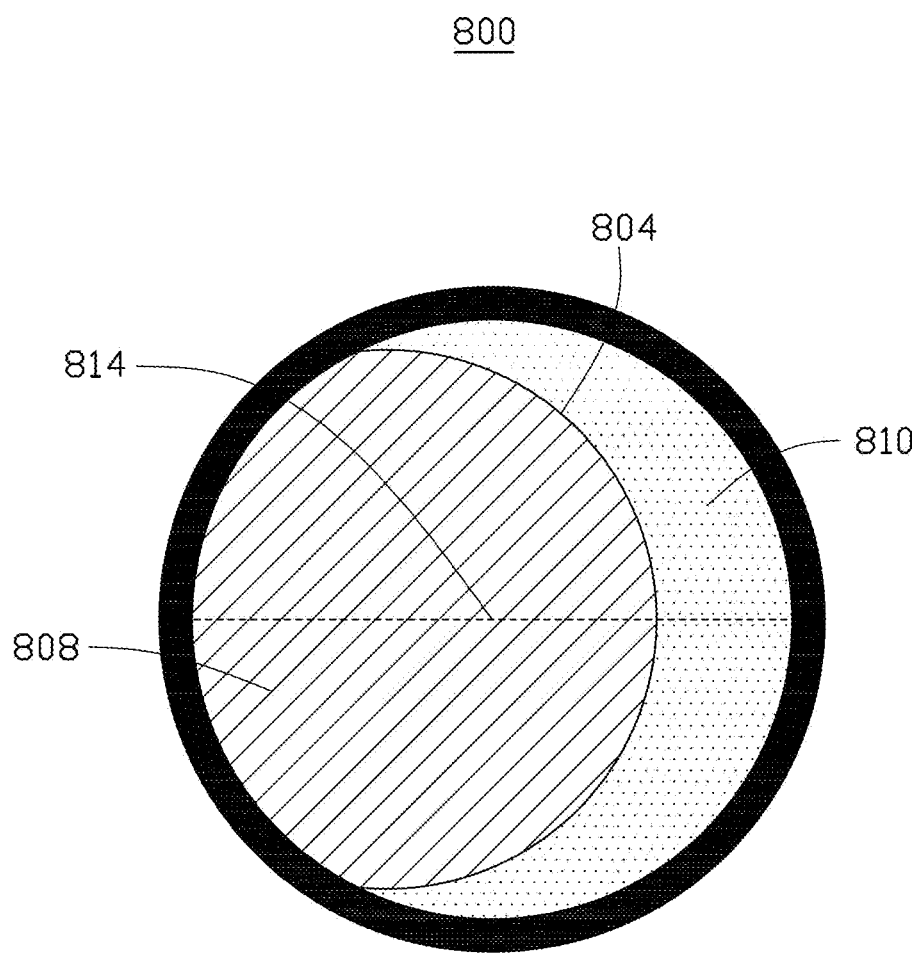
FIG. 8 illustrates a top view of a showerhead according to an example implementation of the present disclosure.

FIG. 8 illustrates a top view of a showerhead 800 of the apparatus 700 according to an example implementation of the present disclosure. As illustrated in FIG. 8, the holes in the showerhead 800 are grouped into a zone 808 at a first side of the showerhead 800 and a zone 810 at a second side of the showerhead 800 opposite the first side of the showerhead 800. The zones 808 and 810 define an interface 804 therebetween. In various implementations, the interface 804 is arcuate. In other implementations, the interface 804 is straight.

In this example implementation, the sizes (e.g., widths or diameters) of the holes in the zone 808 are identical to each other. The sizes (e.g., widths or diameters) of the holes in the zone 810 are identical to each other. The holes in the zone 810 have a larger hole size than the holes in the zone 808. For example, the size of the holes in the zone 808 is from about 0.68 mm to about 0.72 mm. The term "about" means ±0.02 mm.

In this example implementation, the center 814 of the showerhead 800 is inside the zone 808. In an alternative implementation, the center 814 of the showerhead 800 is inside the zone 810. The size of the holes in the zone 810 is from about 0.72 mm to about 0.74 mm. The term "about" means ±0.02 mm. In this example implementation, the area of the zone 808 is larger than the area of the zone 810. In various implementations, the open area of the zone 808 is from about 800 mm2 to about 1000 mm2. The open area of the zone 810 is from about 200 mm2 to about 300 mm2. The term "open area" means how much of the area is occupied by the holes. In various implementations, each of the holes has cross-section (e.g., a circular cross-section). The summation of the areas of the cross-sections of the holes in the zone 808 is from about 800 mm2 to about 1000 mm2. The summation of the areas of the cross-sections of the holes in the zone 810 is from about 200 mm2 to about 300 mm2.

Figure 9:
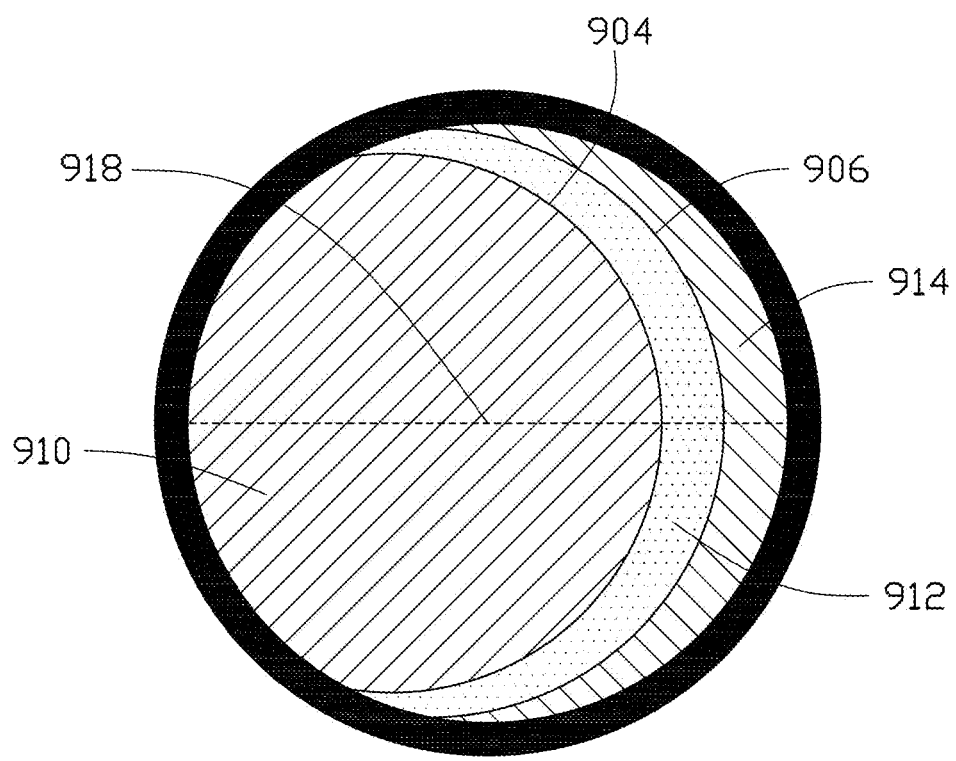
FIG. 9 illustrates a top view of a showerhead according to an example implementation of the present disclosure.

FIG. 9 illustrates a top view of a showerhead 900 of the apparatus 700 according to an example implementation of the present disclosure. As illustrated in FIG. 9 the showerhead 900 differs from the showerhead 800 in that the showerhead 900 is divided into three zones 910, 912, 914, each of which is formed with a plurality of holes. The zone 910 is at a first side of the showerhead 900. The zone 914 is at a second side of the showerhead 900 opposite the first side of the showerhead 900. The zone 912 is between the zones 910, 914. The zones 910, 912 define a first interface 904 therebetween. The zones 912, 914 define a second interface 906 therebetween. In various implementations, the first/second interface 904/906 is arcuate. In other implementations, the first/second interface 906 is straight. In this example implementation, the second interface 906 has a longer length than the first interface 904. In various implementations, the second interface 906 has substantially the same length as the first interface 904. In other implementations, the second interface 906 has a shorter length than the first interface 904.

In this example implementation, the sizes (e.g., widths or diameters) of the holes in the zone 910 are identical to each other. The sizes (e.g., widths or diameters) of the holes in the zone 912 are identical to each other. The sizes (e.g., widths or diameters) of the holes in the zone 914 are identical to each other.

In this example implementation, the center 918 of the showerhead 900 is inside the zone 910. In various implementations, the center 918 of the showerhead 900 is inside the zone 912. In other implementations, the center 918 of the showerhead 900 is inside the zone 914. The size of the holes in the zone 914 is larger than the size of the holes in the zone 912. The size of the holes in the zone 912 is larger than the size of the holes in the zone 910. For example, the size of the holes in the zone 910 is from about 0.68 mm to about 0.72 mm. The term "about" means ±0.02 mm. The size of the holes in the zone 912 is from about 0.72 mm to about 0.74 mm. The term "about" means ±0.02. The size of the holes in the zone 914 is from about 0.74 mm to about 0.76 mm. The term "about" means ±0.02 mm.

In this example implementation, the area of the zone 910 is larger than the area of the zones 912, 914. The area of the zone 914 is larger than the area of the zone 912. In other implementations, the open area of the zone 914 is substantially equal to the open area of the zone 912. In various implementations, the open area of the zone 910 is from about 700 mm$^2$ to about 900 mm$^2$. The open area of the zone 912 is from about 100 mm$^2$ to about 200 mm$^2$. The open area of the zone 914 is from about 200 mm$^2$ to about 300 mm$^2$. The term "open area" means how much of the area is occupied by the holes. In various implementations, each of the holes has cross-sections (e.g., a circular cross-section). The summation of the areas of the cross-sections of the holes in the zone 910 is from about 700 mm$^2$ to about 900 mm$^2$. The summation of the areas of the cross-sections of the holes in the zone 912 is from about 100 mm$^2$ to about 200 mm$^2$. The summation of the areas of the cross-sections of the holes in the zone 914 is from about 200 mm$^2$ to about 300 mm$^2$.

In various implementations, the sizes, i.e., widths or diameters, of the holes of the showerhead of the present disclosure may linearly or exponentially increases from the showerhead center to the showerhead edge. In certain implementations, the sizes, i.e., widths or diameters of the holes of the showerhead of the present disclosure may linearly or exponentially increases from the showerhead edge to the showerhead center. In other implementations, the holes of the showerhead of the present disclosure may be grouped, each of which has a distinct hole size.

Figure 11:
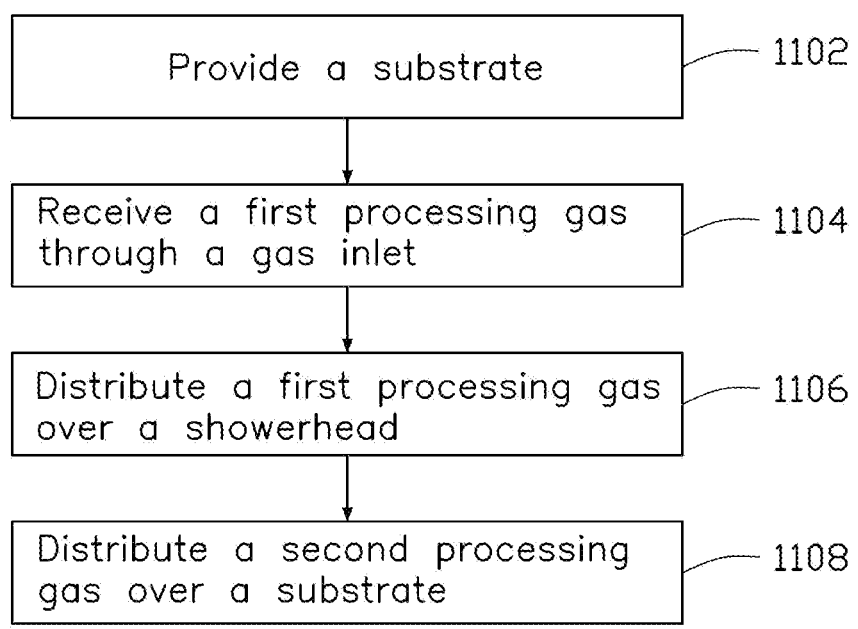
FIG. 11 is a flowchart illustrating a method for processing a substrate according to an example implementation of the present disclosure.

FIG. 11 is a flowchart illustrating a method 1100 for processing a substrate according to an example implementation of the present disclosure. The method 1100 begins with block 1102 in in which a substrate is provided. The method 1100 continues with block 1104 in which a first processing gas is received in a processing chamber. The method 1100 continues with block 1106 in which the first processing gas is unevenly distributed over a showerhead. The method 1100 continues with block 1108 in which a second processing gas is evenly distributed over the substrate.

In various implementations for the method 1100, the showerhead includes a plurality of through holes in two or more zones of the showerhead that allow a first processing gas to flow therethrough. The sizes (e.g., widths or diameters) of the holes in the showerhead are varied from one zone to another.

In various implementations for the method 1100, the holes in the showerhead are grouped into two or more zones (e.g., a first zone and a second zone). The holes in the second zone may be configured to have a larger size, i.e., width or diameter, than the holes in the first zone. For example, the size of the holes in the first zone is from about 0.68 mm to about 0.72 mm. The term "about" means ±0.02 mm. The size of the holes in the second zone is from about 0.72 mm to about 0.74 mm. The term "about" means ±0.02. The open area of the first zone is from about 800 mm$^2$ to about 1000 mm$^2$. The open area of the second zone is from about 200 mm$^2$ to about 300 mm$^2$. The term "open area" means how much of the area is occupied by the holes. In various implementations, each of the holes has cross-sections (e.g., a circular cross-section). The summation of the areas of the cross-sections of the holes in the first zone is from about 800 mm² to about 1000 mm². The summation of the areas of the cross-sections of the holes in the second zone is from about 200 mm² to about 300 mm².

In various implementations for the method 1100, the showerhead is a triple zone type showerhead. That is, the showerhead has first, second, and third zones, each of which has a plurality of holes. The sizes (e.g., widths or diameter) of the holes in the first zone is different from the sizes of the holes in the second and third zones. The size of the holes in the second zone is different from the size of the holes in the third zone. In various implementations, the size of the holes in the third zone is larger than the size of the holes in the second zone. The size of the holes in the second zone is larger than the size of the holes in the first zone. For example, the size of the holes in the first zone is from about 0.68 mm to about 0.72 mm. The term "about" means ±0.02 mm. The size of the holes in the second zone 312 is from about 0.72 mm to about 0.74 mm. The term "about" means ±0.02. The size of the holes in the third zone is from about 0.74 mm to about 0.76 mm. The term "about" means ±0.02. The open area of the first zone is from about 700 mm² to about 900 mm². The open area of the second zone is from about 100 mm² to about 200 mm². The open area of the third zone is from about 200 mm² to about 300 mm². The term "open area" means how much of the area is occupied by the holes. In various implementations, each of the holes has cross-sections (e.g., a circular cross-section). The summation of the areas of the cross-sections of the holes in the first zone is from about 700 mm² to about 900 mm². The summation of the areas of the cross-sections of the holes in the second zone is from about 100 mm² to about 200 mm². The summation of the areas of the cross-sections of the holes in the third zone is from about 200 mm² to about 300 mm².

In an implementation of the present disclosure, an apparatus for processing a substrate is provided. The apparatus comprises a processing chamber and a showerhead. The showerhead is in the processing chamber and has a plurality of first holes with a first size in a first zone of the showerhead and a plurality of second holes with a second hole size in a second zone of the showerhead. The first hole size is different from the second hole size. The first zone is surrounded by the second zone. An area of the first zone is larger than an area of the second zone.

In another implementation of the present disclosure, an apparatus for processing a substrate is provided. The apparatus comprises a processing chamber and a showerhead. The showerhead is in the processing chamber and has a plurality of first holes in a first zone of the showerhead and a plurality of second holes in a second zone of the showerhead. The second holes are larger than the first holes. An area of the first zone is larger than an area of the second zone. The first zone and the second zone define an arcuate interface therebetween.

In another implementation of the present disclosure, a method comprises receiving a first processing gas through a gas inlet, unevenly distributing the first processing gas over a showerhead, and evenly distributing a second processing gas over a substrate flowing from the showerhead.

The implementations shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the implementations described above may be modified within the scope of the claims.

What is claimed is:

1. A gas distribution method comprising:
   receiving a first processing gas through a gas inlet;
   unevenly distributing the first processing gas over a showerhead;
   flowing the first processing gas through a plurality of holes in the showerhead, wherein the plurality of holes are grouped into a first zone of the showerhead and a second zone of the showerhead, the holes in the second zone have a larger hole size than the holes in the first zone, and the hole diameter of the holes in the first zone is from about 0.66 mm to about 0.74 mm; and
   evenly distributing a second processing gas over a substrate flowing from the showerhead.

2. The method of claim 1, wherein the hole diameter of the holes in the second zone is from about 0.74 mm to about 0.76 mm.

3. The method of claim 1, wherein a width of the first zone is from about 210 mm to about 250 mm.

4. The method of claim 1, wherein the second zone has a first width at a first side of the first zone, and a second width at a second side of the first zone opposite the first side of the first zone and different from the first width.

5. The method of claim 1, wherein the first zone is surrounded by the second zone.

6. The method of claim 1, wherein a center of the showerhead is in the first zone.

7. The method of claim 1, wherein the showerhead further has a plurality of third holes in a third zone of the showerhead and larger than the second holes.

8. The method of claim 1, wherein the showerhead further has a plurality of third holes in a third zone of the showerhead and an area of the third zone is larger than the area of the second zone.

9. The method of claim 1, wherein an open area of the first zone is from about 800 mm² to about 1000 mm², and an open area of the second zone is from about 200 mm² to about 300 mm².

10. The method of claim 1, wherein an interface between the first zone and the second zone is circular, polygonal, arcuate or straight.

* * * * *